US006674783B1

(12) United States Patent
Funabashi et al.

(10) Patent No.: US 6,674,783 B1
(45) Date of Patent: Jan. 6, 2004

(54) DISTRIBUTED FEEDBACK TYPE SEMICONDUCTOR LASER DEVICE AND METHOD OF MANUFACTURING THE SAME

(75) Inventors: Masaki Funabashi, Yokohama (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/537,216

(22) Filed: Mar. 29, 2000

(30) Foreign Application Priority Data

Mar. 31, 1999 (JP) .............................. 11-093184

(51) Int. Cl.[7] .............................. H01S 3/08; H01S 5/00; H01S 3/20
(52) U.S. Cl. .............................. 372/96; 372/43; 372/50; 372/54
(58) Field of Search .............................. 372/43, 45, 46, 372/50, 96, 49, 54

(56) References Cited

U.S. PATENT DOCUMENTS 6,175,581 B1 * 1/2001 Sato .............................. 372/44
6,205,165 B1 * 3/2001 Yamamoto et al. ........... 372/96

* cited by examiner

Primary Examiner—Paul Ip
Assistant Examiner—Armando Rodriguez
(74) Attorney, Agent, or Firm—Oblon, Spivak, McClelland, Maier & Neustadt, P.C.

(57) ABSTRACT

Disclosed are a gain coupled distributed feedback type semiconductor laser device which has a high single-mode yield and a smaller variation in the oscillation threshold current and luminous efficiency, and a method of manufacturing the same. The semiconductor laser device has a gain or loss which periodically changes, and comprises a cavity; and a diffraction grating formed in the cavity in such a way that an absolute value of a gain coupling coefficient in a vicinity of at least one of facets of the cavity is smaller than an absolute value of a gain coupling coefficient in the other area.

6 Claims, 1 Drawing Sheet

DISTRIBUTED FEEDBACK TYPE SEMICONDUCTOR LASER DEVICE AND METHOD OF MANUFACTURING THE SAME

BACKGROUND OF THE INVENTION

1. Field of the Invention

The present invention relates to a distributed feedback type semiconductor laser device and a method of manufacturing the same, and, more particularly, to a gain coupled distributed feedback type semiconductor laser device capable of reducing a variation in laser characteristics typified by the oscillation threshold current and luminous efficiency, and a method of manufacturing the same.

2. Prior Art

Distributed feedback type semiconductor laser devices have a predetermined layer structure comprised of semiconductor materials and a cavity of a predetermined cavity length in which a diffraction grating for periodically changing the real part or the imaginary part of the refractive index is formed. The semiconductor laser devices have such a wavelength selectability that the diffraction grating feeds back only a laser beam of a specific wavelength. In the distributed feedback type semiconductor laser devices, the diffraction grating that has the aforementioned capability is generally formed evenly over the entire area between both facets of the cavity in the lengthwise direction (the waveguide direction of light).

The distributed feedback type semiconductor laser devices include an index coupled type in which the real part of the refractive index periodically varies in the cavity, a gain coupled type in which the imaginary part of the refractive index periodically varies in the cavity, and a complex coupled type in which the real part and the imaginary part of the refractive index both periodically vary in the cavity.

The index coupled type semiconductor laser device frequently oscillates in two modes near the Bragg wavelength. When there is no reflection on both facets of the cavity, particularly, this semiconductor laser device always oscillates in two modes near the Bragg wavelength. Even when there is reflection on the facets of the cavity, the semiconductor laser device may oscillate in one of the two modes. This oscillation depends on the phase of the diffraction grating that is located in the vicinity of the facets of the cavity.

The facets of a semiconductor laser device are normally formed by cleaving. It is however difficult to control the phase of the diffraction grating on (and near) the facets of the cavity by cleaving. Therefore, the phase of the diffraction grating on the facets of the cavity and, eventually, the single-mode characteristic defined by that phase vary from one semiconductor laser device manufactured to another. In other words, the index coupled type suffers a lower single-mode yield.

Even when there is reflection on the facets of the cavity, the gain coupled type semiconductor laser device is more likely to have single-mode oscillation as compared with the index coupled type. The pure gain coupled distributed feedback type semiconductor laser device essentially oscillates at the Bragg wavelength in single mode.

According to the complex coupled type, one of two modes which sandwich the stop band in between is likely to be selected so that the single-mode yield becomes higher than that of the index coupled type.

To acquire a high single-mode yield, the gain coupled type distributed feedback type semiconductor laser device is more suitable than the index coupled type.

Though having less influence of reflection at the facets than the index coupled type, the gain coupled type is actually affected by such reflection however small it is. Actually, a variation in the laser characteristics of the gain coupled type is recognized depending on the phase of the diffraction grating on the facets of the cavity. The following explains the reason.

In the gain coupled distributed feedback type semiconductor laser device, while the crest of the standing wave in oscillation mode which is formed by the distributed feedback is coupled to that part of the diffraction grating which has a large gain, the trough of the standing wave is coupled to that part of the diffraction grating which has a small gain. Because the facets of the cavity of a semiconductor laser device has free end reflection, the crest of the standing wave formed by the facet reflection always coincides with the positions of the facets of the cavity.

Since, as mentioned above, it is difficult to control the positional relationship between the facets (cleaved faces) of the cavity and the diffraction grating depending on cleaving at the time of manufacturing the semiconductor laser device, however, the crest and trough of the standing wave formed by the distributed feedback do not necessarily coincide with the crest and trough of the standing wave formed by reflection at the facets of the cavity and they vary from one manufactured device to another.

When the crest and trough of the standing wave formed by the distributed feedback match with those of the standing wave formed by the reflection at the facets of the cavity, the acquired semiconductor laser device has a low oscillation threshold current and high luminous efficiency. When those two standing waves do not have matched crests and troughs, however, the acquired semiconductor laser device may oscillate in single mode but suffers degraded laser characteristics, such as an increased oscillation threshold current and reduced luminous efficiency.

As apparent from the above, the gain coupled distributed feedback type semiconductor laser device that has the diffraction grating formed over the entire area in the cavity has the inherent problem of causing a variation in laser characteristics as the standing wave formed by the distributed feedback and the standing wave formed by the reflection at the facets of the cavity enhance or weaken each other based on a variation in the phase of the diffraction grating on the facets of the cavity which is caused by cleaving at the time of manufacturing the semiconductor laser device.

OBJECT AND SUMMARY OF THE INVENTION

Accordingly, it is an object of the present invention to provide a gain coupled distributed feedback type semiconductor laser device which has a high single-mode yield and a smaller variation in laser characteristics typified by the oscillation threshold current and luminous efficiency, and a method of manufacturing the same.

The present inventors contemplated on the following points while they made extensive studies to achieve the above object.

(1) First, the crest of the standing wave that is formed by the distributed feedback is gain-coupled to that part of the diffraction grating which has a large gain, and the trough of the standing wave is coupled to that part of the diffraction grating which has a small gain.

(2) By contrast, the crest of the standing wave that is formed by reflection of a laser beam which is caused by other than distributed feedback, specifically, reflection on the facets of the cavity, is always positioned on those facets of the cavity.

(3) Because the phase of the diffraction grating on the facets of the cavity that are formed by cleaving varies, the facets of the cavity may not be the large-gain portion of the diffraction grating. Therefore, the crest of the standing wave that is formed by the distributed feedback need not be surely coupled to the large-gain portion of the diffraction grating formed on (and near) the facets of the cavity. This causes various interferences between the distributed feedback and the reflection on the facets of the cavity, resulting in a variation in laser characteristics.

(4) If the diffraction grating having such a structure as to permit the crest of the standing wave formed by the distributed feedback to be surely coupled to the large-gain-coupling portion of the diffraction grating at (and in the vicinity of) the facets of the cavity is formed inside the cavity, therefore, it is possible to suppress the aforementioned interferences between the distributed feedback and the facets of the cavity.

(5) The above structure can be achieved by forming the diffraction grating over the entire area in the diffraction grating in such a way that the gain coupling coefficient of that portion of the diffraction grating which is located at (and in the vicinity of) the facets of the cavity or by not forming the diffraction grating at (and in the vicinity of) the facets of the cavity, so that the gain coupling does not occur there.

The present inventors conducted experiments in consideration of those points, and having confirmed that their contemplation was correct, developed a gain coupled distributed feedback type semiconductor laser device of this invention.

According to the first aspect of this invention, there is provided a gain coupled distributed feedback type semiconductor laser device whose gain or loss periodically changes, which comprises a cavity: and a diffraction grating formed in the cavity in such a way that an absolute value of a gain coupling coefficient in a vicinity of an area where reflection of a laser beam is caused by other than distributed feedback is smaller than an absolute value of a gain coupling coefficient in the other area.

According to the second aspect of this invention, there is provided a gain coupled distributed feedback type semiconductor laser device whose gain or loss periodically changes, which comprises a cavity; and a diffraction grating formed in the cavity in such a way that an absolute value of a first gain coupling coefficient in a vicinity of at least one of facets of the cavity is smaller than an absolute value of a second gain coupling coefficient in the other area. In this case, the length of the at least one of the facets of the cavity where the absolute value of the first gain coupling coefficient is smaller than the absolute value of the second gain coupling coefficient may be at least 10 $\mu$m, and especially, the diffraction grating may not be formed at least in a vicinity of the facets of the cavity.

According to the third aspect of this invention, there is provided a method of manufacturing the distributed feedback type semiconductor laser device of the first aspect or the second aspect, which is characterized in that an electron beam writing system is used at a time of forming a diffraction grating in a cavity.

According to the fourth aspect of this invention, there is provided a method of manufacturing the distributed feedback type semiconductor laser device of the first aspect or the second aspect, which is characterized in that at the time of forming a diffraction grating in a cavity, an interference exposure apparatus is used to form the diffraction grating over an entire area inside the cavity, and a part of the diffraction grating is then removed.

DETAILED DESCRIPTION OF THE INVENTION

Figure 1:
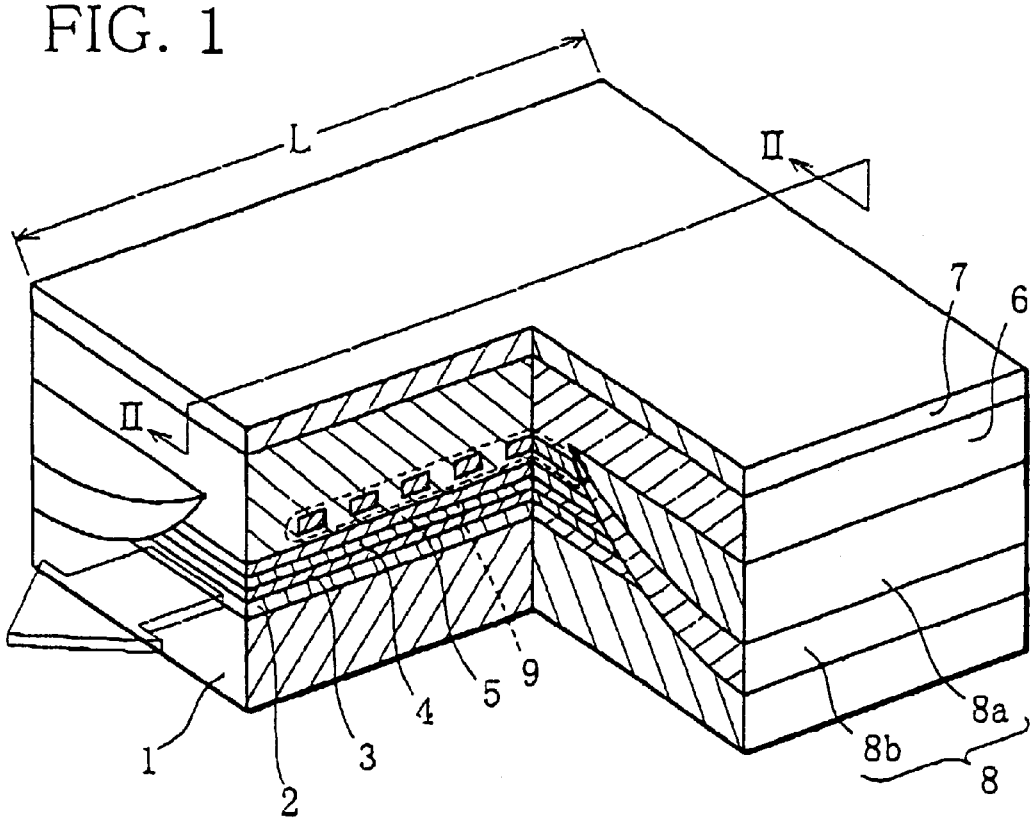
FIG. 1 is a partly cutaway perspective view exemplifying a layer structure of a laser device according to the present invention.
Figure 2:
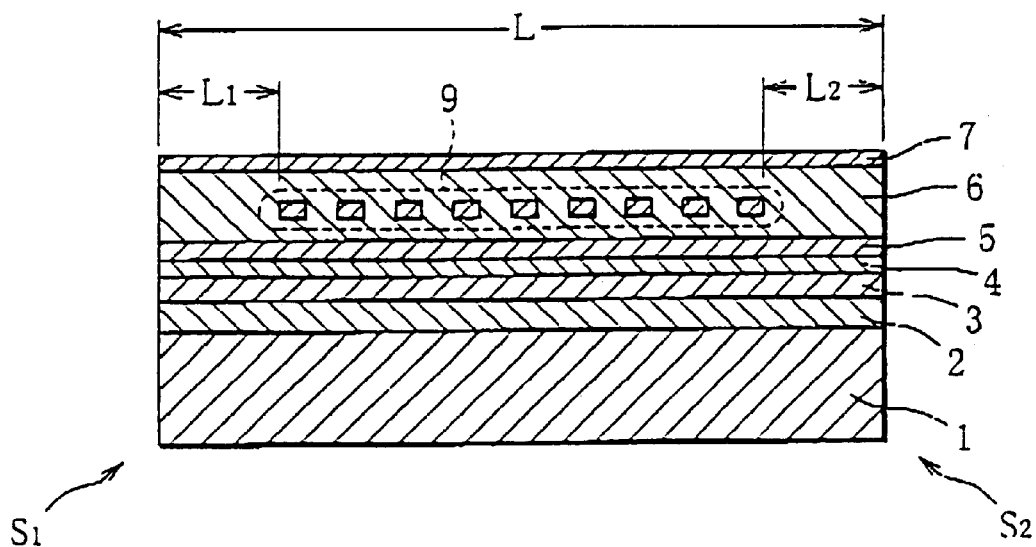
FIG. 2 is a cross-sectional view along the line II—II in FIG. 1.

In a laser device according to this invention, the length of a cavity is set to L as shown in FIGS. 1 and 2. The layer structure of the laser device comprises a substrate 1 of, for example, n-InP, a lower clad layer 2 of n-InP formed on the substrate 1, and a lower light confinement layer 3 of, for example, i-$Ga_{0.23}In_{0.77}As_{0.42}P_{0.58}$, an activation layer 4 of a multiple quantum well structure comprised of a GaInAs(P) well layer and GaInAsP barrier layer, and an upper light confinement layer 5 of, for example, i-$Ga_{0.23}In_{0.77}As_{0.42}P_{0.58}$ formed on the lower clad layer 2 in the named order. The layer structure further has an upper clad layer 6 of, for example, p-InP and a contact layer 7 of, for example, p-GaInAs, both formed on the upper light confinement layer 5, and the overall side portions are buried with a buried layer 8 which comprises a layer 8a of, for example, p-InP and a layer 8b of, for example, n-InP.

A diffraction grating 9 of, for example, p-InGaAs which will be discussed later is formed as a light absorbing layer in the upper clad layer 6.

A lower electrode (not shown) is formed at the back of the substrate 1 by vapor-depositing, for example, AuGeNi, and an upper electrode (not shown) is formed on the contact layer 7 by vapor-depositing, for example, Ti/Pt/Au, with reflection films (not shown) of predetermined reflectances respectively formed on both facets of the cavity.

In this laser device, the diffraction grating 9 is not formed in the areas of lengths $L_1$ and $L_2$ from the facets $S_1$ and $S_2$ of the cavity but is formed only in the center area with a length of ($L-L_1-L_2$).

That is, the areas extending from the facets $S_1$ and $S_2$ of the cavity over the lengths $L_1$ and $L_2$ are the upper clad layer 6 itself, so that no gain coupling occurs there. Therefore, the absolute values of the gain coupling coefficients of the areas $L_1$ and $L_2$ are smaller than that of the area where the diffraction grating 9 is located. (In this example, the absolute values of the gain coupling coefficients of those areas $L_1$ and $L_2$ are virtually zero.)

Because the laser device with the above structure has no diffraction grating present in the vicinity of the facets $S_1$ and $S_2$ of the cavity, the distributed feedback oriented gain coupling of the standing wave does not occur. Therefore, this suppresses an interference between the standing wave formed by the distributed feedback and the standing wave formed by the reflection at the facets of the cavity, thus resulting in a smaller variation in laser characteristics.

While the lengths of the areas $L_1$ and $L_2$ are determined by the cavity length L, it is preferable that those lengths be approximately set equal to or greater than 40 times the period of the standing wave in the cavity. For example, the lengths are approximately 10 $\mu$m for an InP-based laser device of 1.55 $\mu$m wavelength. With the lengths shorter than 10 μm, the interference between the distributed feedback and the reflection at the facets $S_1$ and $S_2$ of the cavity starts to appear, leading to a variation in laser characteristics.

The diffraction grating 9 is formed in the following manner in this invention.

First, in the formation of the layer structure shown in FIG. 2, after the upper light confinement layer 5 is formed, part of the upper clad layer 6 is formed on the upper light confinement layer 5. Then, a semiconductor material for the diffraction grating is deposited on this partly formed upper clad layer 6 to form a layer having a predetermined thickness.

Next, the resist pattern for the diffraction grating is formed on this semiconductor-material layer and is then subjected to etching to convert this layer into the diffraction grating having a predetermined period in the lengthwise direction of the cavity. At this time, an electron beam exposuring system, which is adequate to form an arbitrary diffraction grating pattern, is used to form the diffraction grating.

The use of the electron beam exposuring system can freely form the diffraction grating pattern as shown in FIG. 2.

Alternatively, an interference exposure apparatus may be used on the semiconductor materiel for the diffraction grating to thereby form the diffraction grating of a predetermined period over the entire length of the cavity, after which both end portions are etched out, yielding the $L_1$ and $L_2$ without diffraction grating.

EXAMPLES

A semiconductor laser device having the structure as shown in FIGS. 1 and 2 was produced in the following manner.

The lower clad layer 2 of n-InP and 1 μm in thickness, the lower light confinement layer 3 of i-$Ga_{0.23}In_{0.77}As_{0.42}P_{0.58}$ and 100 nm in thickness, the activation layer 4 of a multiple quantum well structure comprised of GaInAs and GaInAsP, and the upper light confinement layer 5 of i-$Ga_{0.23}In_{0.77}As_{0.42}P_{0.58}$ and 100 nm in thickness were formed in order on the n-InP substrate 1 by MOCVD.

Then, p-InP was deposited 100 nm thick on the upper light confinement layer 5. Then a 30-nm thick layer of p-InGaAs was formed on this p-INP layer at a growth temperature of 600° C. This layer would be converted into the diffraction grating.

After a resist for an electron beam was coated on the InGaAs layer to the thickness of about 100 nm, a plane resist pattern for the diffraction grating having a period of approximately 240 nm was formed by using the electron beam exposuring system.

At this time, various plane diffraction grating patterns were actually formed which had values as shown in Table 1 with the diffraction grating having a length of 300 μm positioned in the center of the cavity having a length L between facets (cleaved faces) $S_1$ and $S_2$ and having lengths $L_1$ and $L_2$ from the facets $S_1$ and $S_2$ set equal to each other ($L_1=L_2$).

With each of the plane patterns used as a mask, etching to the depth of 50 nm was performed by using a bromine-based etchant, thereby forming the diffraction grating of InGaAs including part of p-InP and with a period of 240 nm.

After the surface resist was removed, p-InP was grown on that portion again to bury the diffraction grating and planarize the overall surface. The growth temperature was set to 520° C. in order to prevent deformation of the formed diffraction grating.

Next, an SiNx film was formed on the entire planarized surface by plasma CVD, and was then formed into stripes having a width of 4 μm extending in the lengthwise direction of the cavity to be formed, by photolithography and RIE.

With the stripes of the SiNx film used as a mask, the partly formed upper clad layer 6, the upper light confinement layer 5, the activation layer 4, the lower light confinement layer 3 and part of the lower clad layer 2 were etched out to form mesa stripes having a width of approximately 1.5 μm.

Next, with the SiNx film used as a mask for selective growth, the p-InP layer 8a and n-InP layer 8b were selectively grown in order on both sides of the mesa stripes, thus forming the buried layer 8.

After removing the SiNx film, p-InP was deposited on the entire surface of the resultant structure to form the upper clad layer 6 on which the contact layer 7 of p-GaInAs was formed.

After the back side of the substrate 1 was polished so that the resultant structure had a thickness of 120 μm, the lower electrode of AuGeNi was formed on the polished side and the upper electrode of Ti/Pt/Au was formed on the contact layer 7.

The acquired substrate was so cleaved that the portions where the diffraction grating was not formed became the cleaved facets. The length of each type of cavity is given in Table 1.

As a comparative example, a laser device with the diffraction grating evenly formed over the entire lengthwise area in the cavity ($L_1=L_2=0$) was also produced.

Those laser devices were combined to ordinary package type stems and their laser characteristics were checked with both facets left as cleaved. The results are shown in Table 1. Each of the numerals in the table is an average value per 100 unintentionally selected laser devices.

TABLE 1

|  |  | Device 1 (Comparative Example) | Device 2 | Device 3 | Device 4 | Device 5 | Device 6 |
|---|---|---|---|---|---|---|---|
| Cavity | Length of diffraction grating (μm) | 300 | 300 | 300 | 300 | 300 | 300 |
|  | Length of area $L_1$ (=$L_2$) (μm) | 0 | 5 | 10 | 25 | 50 | 100 |
|  | Entire length of cavity (L:μm) | 300 | 310 | 320 | 350 | 400 | 500 |
| Laser charac- teristics | Single mode yield (%) | 85 | 86 | 89 | 91 | 90 | 87 |
|  | Oscillation threshold    Average value (n = 100) | 12.6 | 12.6 | 12.8 | 12.8 | 13.4 | 14.7 |

TABLE 1-continued

|  |  | Device 1 (Comparative Example) | Device 2 | Device 3 | Device 4 | Device 5 | Device 6 |
|---|---|---|---|---|---|---|---|
| current (mA) | Standard deviation | 2.6 | 2.5 | 1.0 | 0.8 | 0.9 | 1.2 |
| Luminous efficiency (W/A) | Average value (n = 100) | 0.23 | 0.23 | 0.24 | 0.25 | 0.24 | 0.22 |
|  | Standard deviation | 0.082 | 0.079 | 0.028 | 0.015 | 0.026 | 0.041 |

The following are apparent from Table 1.

(1) As apparent from the comparison of the device 1 with the device 4, the oscillation threshold current of the device 4 is slightly higher than that of the device 1, but the difference is negligible. The device 4 actually demonstrated an effect of significantly reducing a variation in laser characteristics, which would more than compensate for the increased oscillation threshold current.

The reason for the slight increase in oscillation threshold current seems that the length of the cavity of the device 4 is longer by (25+25=50) μm than that of the device 1.

Further, the single-mode yield of the device 4 becomes higher than that of the device 1.

Furthermore, the luminous efficiency of the device 4 is slightly improved as compared with that of the device 1 and its variation becomes considerably smaller.

It is evident from the above that providing the areas $L_1$ and $L_2$ in the cavity is very effective.

(2) As apparent from the comparison of the device 1 with the device 2, with the length of the area $L_1$ being 5 μm, variations in oscillation threshold current and luminous efficiency of the device 2 do not differ much from those of the device 1.

This means that even when the areas $L_1$ and $L_2$ are provided, they are not effective if their lengths are as short as 5 μm. It is apparent from the variations (standard deviations) in oscillation threshold current and luminous efficiency of the device 2 and the device 3 that the preferable lengths of the areas $L_1$ and $L_2$ would be equal to or greater than 10 μm.

According to the Examples, the laser devices have the oscillation wavelength of approximately 1550 nm and the period of the diffraction grating (≈the period of the standing wave) is 240 nm. Therefore, the lengths of 10 μm that the areas $L_1$ and $L_2$ have are equivalent to about 40 periods of the standing wave.

In other words, generally speaking, it is preferable to set the lengths of the areas $L_1$ and $L_2$ to about 40 times the period of the standing wave or greater.

(3) Increasing the lengths of the areas $L_1$ and $L_2$ increase the entire length of the cavity. This leads to a higher oscillation threshold current.

With the length of the diffraction grating set to 300 μm, if the lengths of the areas $L_1$ and $L_2$ are set to 25 μm, the variations in the oscillation threshold current and luminous efficiency of the laser device are minimized.

(4) According to the conventional structure where the gain-coupled diffraction grating is evenly present along the whole cavity, the crest and trough of the standing wave formed by the distributed feedback do not necessarily coincide with those of the standing wave formed by reflection at the facets of the cavity. If a film with a high reflectance is coated on the facets of the cavity, therefore, significant deterioration of the oscillation threshold current and the luminous efficiency is clearly seen, thereby considerably reducing the yield of manufactured laser devices. By way of contrast, the device structure of this invention makes it difficult to cause an interference between the standing wave formed by the distributed feedback and the standing wave formed by reflection at the facets of the cavity. Even if a film with a high reflectance is coated on the facets of the cavity, therefore, the deterioration of the oscillation threshold current and the luminous efficiency is suppressed.

According to the device structure of this invention, therefore, the luminous efficiency from the front facet of the cavity can be enhanced by forming a film with a low reflectance on the front facet and forming a film with a high reflectance on the rear facet, thus ensuring high optical outputs. When one of the facets was coated in such a way as to be in reflectionless state, no facet reflection occurred there. Forming the diffraction grating to the facets of the device would not therefore raise a significant problem.

According to the gain coupled distributed feedback type semiconductor laser device embodying this invention, as apparent from the above, the diffraction grating formed in the cavity has such a structure as to be able to suppress an interference between the standing wave formed by the distributed feedback and the standing wave formed by reflection at the facets of the cavity. This makes it possible to suppress variations in oscillation threshold current and luminous efficiency as well as to ensure a high single-mode yield.

What is claimed is:

1. A gain coupled distributed feedback type semiconductor laser device comprising:

a cavity having facets at both ends thereof;

a first region which is located in said cavity and having a diffraction grating with a predetermined period and being formed in said cavity between the facets and in which at least one of a gain and a loss of a laser beam in a propagation direction thereof periodically changes; and a second region located near both of the facets of the cavity and excluding the first region, the second region having an absolute value of a gain coupling coefficient smaller than that of the first region, a length of said second region being greater than said predetermined period.

2. A gain coupled distributed feedback type semiconductor laser device comprising:

a cavity having facets at both ends thereof;

a first region which is located in said cavity and having a diffraction grating with a predetermined period and being formed in said cavity between the facets and in which at least one of a gain and a loss of a laser beam in a propagation direction thereof periodically changes; and a second region located near at least one of the facets of the cavity and excluding the first region, the second region having an absolute value of a gain coupling coefficient smaller than that of the first region, a length of said second region being greater than said predetermined period.

3. The distributed feedback type semiconductor laser device according to claim 1, wherein the length of said second region being equal to or greater than 40 times a period of a standing wave.

4. The distributed feedback type semiconductor laser device according to claim 1, wherein said diffraction grating is present only in the first region.

5. The distributed feedback type semiconductor laser device according to claim 2, wherein the length of said second region being equal to or greater than 40 times a period of a standing wave.

6. The distributed feedback type semiconductor laser device according to claim 2, wherein said diffraction grating is present only in the first region.

* * * * *